(12) United States Patent
Fujiwara

(10) Patent No.: US 6,897,515 B2
(45) Date of Patent: May 24, 2005

(54) SEMICONDUCTOR MEMORY AND SEMICONDUCTOR DEVICE

(75) Inventor: Hideaki Fujiwara, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 322 days.

(21) Appl. No.: 09/899,267

(22) Filed: Jul. 6, 2001

(65) Prior Publication Data

US 2002/0005544 A1 Jan. 17, 2002

(30) Foreign Application Priority Data

Jul. 11, 2000 (JP) .......................................... 2000-209196

(51) Int. Cl.[7] .......................... H01L 29/788; G11C 16/04
(52) U.S. Cl. ........................ 257/315; 257/316; 257/320; 257/322; 365/185.18
(58) Field of Search ................................ 257/314, 315, 257/320, 322, 316; 365/185.18

(56) References Cited

U.S. PATENT DOCUMENTS

| | | | | |
|---|---|---|---|---|
| 5,572,054 A | * | 11/1996 | Wang et al. | 257/321 |
| 6,330,187 B1 | * | 12/2001 | Choi et al. | 365/185.15 |
| 2002/0020870 A1 | * | 2/2002 | Ueno et al. | 257/315 |

FOREIGN PATENT DOCUMENTS

| | | |
|---|---|---|
| JP | 53-060582 | 5/1978 |
| JP | 59-074666 | 4/1984 |
| JP | 02-027773 | 1/1990 |
| JP | 04-057369 | 2/1992 |
| JP | 05-234381 | 9/1993 |
| JP | 05-347419 | 12/1993 |
| JP | 06-028878 | 2/1994 |
| JP | 08-036889 | 2/1996 |
| JP | 09-097884 | 4/1997 |
| JP | 9-293383 | 11/1997 |
| JP | 10-163435 | 6/1998 |
| JP | 11-054639 | 2/1999 |
| JP | 11-087659 | 3/1999 |
| JP | 11-134886 | 5/1999 |

OTHER PUBLICATIONS

Communication from the Japanese Patent Office in application No. 2000–209196 dated May 19, 2004 and English language translation.

* cited by examiner

Primary Examiner—Amir Zarabian
Assistant Examiner—Kiesha Rose
(74) Attorney, Agent, or Firm—Westerman, Hattori, Daniels & Adrian, LLP

(57) ABSTRACT

A semiconductor memory capable of attaining a low voltage, a high-speed operation, low power consumption and a high degree of integration is obtained. This semiconductor memory comprises a floating gate electrode, a first source/drain region having a diode structure employed for controlling the potential of the floating gate electrode and a second source/drain region formed to hold a channel region between the same and the first source/drain region. Thus, when a channel of a transistor is turned on in reading, a large amount of current flows from the first source/drain region having a diode structure to a substrate, whereby high-speed reading can be implemented. Further, a negative voltage is readily applied to the first source/drain region having a diode structure, whereby a low voltage and low power consumption are attained and the scale of a step-up circuit is reduced, and hence a high degree of integration can be attained.

14 Claims, 5 Drawing Sheets

SEMICONDUCTOR MEMORY AND SEMICONDUCTOR DEVICE

BACKGROUND OF THE INVENTION

1. Field of the Invention

The present invention relates to a semiconductor memory and a semiconductor device.

2. Description of the Prior Art

Recently, a nonvolatile semiconductor memory such as an EPROM (erasable and programmable read only memory) or an EEPROM (electrically erasable and programmable read only memory) is watched with interest as a semiconductor memory capable of substituting for a magnetic memory such as a hard disk or a floppy disk.

Each memory cell of an EPROM or an EEPROM stores carriers in a floating gate electrode for storing data in response to presence/absence of carriers and reading data by detecting change of a threshold voltage responsive to presence/absence of carriers. In particular, the EEPROM includes a flash EEPROM erasing data on the overall memory cell array or dividing the memory cell array into arbitrary blocks for erasing data in units of the blocks. The flash EEPROM, referred to also as a flash memory, is capable of attaining a high capacity, low power consumption and a high-speed operation and excellent in shock resistance, and hence applied to various types of portable devices. Further, the flash EEPROM having memory cells can be readily integrated as compared with the EEPROM.

In general, a stacked gate memory cell and a split gate memory cell are proposed as those forming a flash EEPROM.

In the stacked gate memory cell, electrons in a channel of a semiconductor substrate are converted to hot electrons and injected into a floating gate electrode in writing for storing electrons in the floating gate electrode. At this time, a voltage of ten-odd V must be applied to a control gate electrode. In erasing for extracting electrons stored in the floating gate electrode of the stacked gate memory cell, a Fowler-Nordheim tunnel current (hereinafter referred to as an F-N tunnel current) is fed from a source region to the floating gate electrode. At this time, a voltage of ten-odd V must be applied to the source region.

In the split gate memory cell, electrons in a channel of a semiconductor substrate are converted to hot electrons and injected into a floating gate electrode in writing for storing electrons in the floating gate electrode. At this time, a voltage of about ten V must be applied to a source region. In erasing for extracting electrons from the floating gate electrode of the split gate memory cell, an F-N tunnel current is fed from a control gate electrode to the floating gate electrode. At this time, a voltage of about ten V must be applied to the control gate electrode.

Thus, each of the conventional stacked gate memory cell and the conventional split gate memory cell utilizes hot electrons for injecting electrons into the floating gate electrode in writing while utilizing an F-N tunnel current for extracting the electrons stored in the floating gate electrode in erasing.

In order to maintain carriers stored in the floating gate electrode over a long period, an insulator film enclosing the floating gate electrode must be increased in thickness. However, electrons are injected into or extracted from the floating gate electrode through hot electrons or an F-N current. As the thickness of the insulator film enclosing the floating gate electrode is increased, therefore, the voltage (hereinafter referred to as an operating voltage of the memory cell) applied to the control gate electrode or the drain region in writing or erasing must be increased.

The operating voltage of the memory cell is generated in a step-up circuit. In this case, the upper limit of practically generable voltages is ten-odd V. When a silicon oxide film is employed as the insulator film enclosing the floating gate electrode, the thickness of this silicon oxide film cannot exceed 8 to 10 nm if the operating voltage of the memory cell is ten-odd V. In general, therefore, the thickness of a silicon oxide film employed as the insulator film enclosing the floating gate electrode is set to 8 to 10 nm, in order to suppress the operating voltage of the memory cell to ten-odd V. When the thickness of the silicon oxide film is about 8 to 10 nm, electrons stored in the floating gate electrode can be maintained for a period (about 10 years) satisfactory to some extent.

Also when holes are stored in the floating gate electrode, the thickness of the silicon oxide film employed as the insulator film enclosing the floating gate electrode is set to 8 to 10 nm similarly to the aforementioned case of storing electrons, for suppressing the operating voltage of the memory cell to ten-odd V and maintaining the holes stored in the floating gate electrode for a period satisfactory to some extent.

The recent flash EEPROM, increased in life by increasing the period for maintaining the carriers stored in the floating gate electrode, is required to attain a lower voltage, an operation at a higher speed, lower power consumption and a higher degree of integration.

As hereinabove described, the thickness of the silicon oxide film employed as the insulator film enclosing the floating gate electrode is generally set to 8 to 10 nm. In order to increase the life of the flash EEPROM, therefore, the thickness of the silicon oxide film must not be reduced beyond 8 nm.

When the operating voltage of the memory cell is reduced, the time (lead time) for stepping up the voltage is so reduced that writing and erasing can be performed at a high speed. Further, power consumption can be reduced. In most frequently performed reading, a low-voltage operation and a large reading cell current are extremely advantageous for high-speed reading.

The scale of the step-up circuit for generating the operating voltage of the memory cell is increased as the generated voltage is increased. The occupied area (transistor size) of a transistor forming a peripheral circuit (a decoder, a sense amplifier, a buffer or the like) of the flash EEPROM is increased on the substrate as the withstand voltage is increased. When the operating voltage of the memory cell s reduced, therefore, the scale of the step-up circuit as well as the size of the transistor forming the peripheral circuit are reduced and hence a higher degree of integration can be attained.

Therefore, all of a high-speed operation, low power consumption and a high degree of integration can be simultaneously implemented by reducing the operating voltage o the memory cell.

In each of the conventional stacked gate memory cell and the conventional split gate memory cell, however, electrons are injected into or extracted from the floating gate electrode through hot electrons or an F-N tunnel current. When a silicon oxide film is employed as the insulator film enclosing the floating gate electrode, therefore, it is difficult to reduce the operating voltage of the memory cell below the present level while maintaining the thickness of the silicon oxide film at the present level of 8 to 10 nm. In other words, it is difficult to reduce the operating voltage of the memory cell while maintaining a life equivalent to the present level unless the structure of the conventional stacked gate or split gate memory cell is changed.

SUMMARY OF THE INVENTION

An object of the present invention is to provide a semiconductor memory capable of attaining a long life, a low voltage, a high-speed operation, low power consumption and a high degree of integration.

Another object of the present invention is to provide a semiconductor device capable of feeding a large amount of current also in a transistor having a large gate length and an easily reduced source-to-drain current.

A semiconductor memory according to an aspect of the present invention comprises a floating gate electrode, a first source/drain region having a diode structure employed for controlling the potential of the floating gate electrode and a second source/drain region formed to hold a channel region between the same and the first source/drain region. The term "source/drain region" stands for a source region or a drain region.

In the semiconductor memory according to this aspect, a large amount of current flows from the first source/drain region having a diode structure to a substrate when a channel of a transistor is turned on in reading due to the aforementioned structure. Thus, a large amount of current can be supplied for reading, for implementing high-speed reading as a result. Particularly in a transistor of a split gate flash memory or the like having a large channel length, it is effective that a large amount of current can be supplied in reading. Due to the diode structure of the first source/drain region employed for controlling the potential of the floating gate electrode, a negative voltage can be readily applied to the first source/drain region having a diode structure without through a complicated structure such as a conventional triple well structure. Therefore, voltages employed for erasing can be sorted into positive and negative levels, and hence the maximum voltage generated through a step-up circuit can be substantially halved. Thus, a low voltage and low power consumption can be attained and the scale of the step-up circuit is reduced, whereby the degree of integration can be improved. Consequently, a semiconductor memory capable of attaining a low voltage, a high-speed operation, low power consumption and a high degree of integration can be provided.

When a negative voltage is applied to the first source/drain region without employing the diode structure according to the present invention, an excessive current may flow between the first source/drain region and the substrate, while an excessive current may flow also between the first source/drain region and the second source/drain region (between a source and a drain) after erasing if either the first source/drain region or the second source/drain region is brought into a floating state in erasing. In this case, the excessive current may disadvantageously exceed the amount of allowable current of the step-up circuit. According to the present invention, such an excessive current can be effectively prevented due to the diode structure.

In the semiconductor memory according to the aforementioned aspect, a negative voltage is preferably applied to the first source/drain region having a diode structure in erasing. Thus, voltages employed for erasing can be sorted into positive and negative levels, whereby the maximum voltage generated through the step-up circuit can be substantially halved. Consequently, a low voltage can be attained and the scale of the step-up circuit is reduced, whereby the degree of integration can be improved.

In the semiconductor memory according to the aforementioned aspect, the first source/drain region preferably includes a second conductivity type first impurity region formed on a first layer consisting of a first conductivity type semiconductor and a first conductivity type second impurity region formed inside the first impurity region, and the first impurity region is preferably formed on the overall region between the first layer and the second impurity region. In this case, the first impurity region can be readily formed through a general ion implantation process with no burden in process. Thus, the diode structure can be readily formed. In this case, the second impurity region may include a first conductivity type third impurity region formed on the first layer to be in contact with the first impurity region and a fourth impurity region formed by a first conductivity type semiconductor film embedded in the third impurity region.

In the semiconductor memory according to the aforementioned aspect, the second impurity region is preferably capacitively coupled with the floating gate electrode through a first insulator film. Thus, the voltage of the second impurity region directly applied from a power source through a wire can be efficiently transmitted to the floating gate electrode by capacitive coupling.

In this case, the semiconductor memory preferably further comprises a control gate electrode formed on the channel region through a gate insulator film, a semiconductor region formed between the control gate electrode and the floating gate electrode, a first tunnel insulator film formed between the semiconductor region and the control gate electrode and a second tunnel insulator film formed between the semiconductor region and the floating gate electrode, for writing data by injecting hot carriers into the floating gate electrode from the control gate electrode through the first tunnel insulator film, the semiconductor region and the second tunnel insulator film. Thus, data can be readily written through the semiconductor region.

In this case, the area of the first insulator film located between the second impurity region and the floating gate electrode is preferably larger than the area of the second tunnel insulator film located between the semiconductor region and the floating gate electrode. In this case, electrostatic capacitance between the second impurity region and the floating gate electrode can be rendered larger than that between the semiconductor region and the floating gate electrode. Thus, the coupling ratio between the second impurity region and the floating gate electrode can be rendered larger than that between the semiconductor region and the floating gate electrode, whereby the potential of the second impurity region can be readily transmitted to the floating gate electrode. In this case, a voltage applied to the second impurity region is preferably transmitted to the floating gate electrode through electrostatic coupling between the second impurity region and the floating gate electrode so that a transistor having the floating gate electrode as the gate enters an ON state and the potential of the semiconductor region reaches a level substantially identical to the potential of the second impurity region. Thus, data can be readily written through the semiconductor region.

In this case, the semiconductor region preferably has a second conductivity type. Further, the width of the semiconductor region is preferably set substantially not more than the mean free path of carriers, transmitted through the barrier of the first tunnel insulator film between the control gate electrode and the semiconductor region, having energy necessary for tunneling through the barrier of the second tunnel insulator film. Due to this structure, almost all carriers transmitted through the barrier of the first tunnel insulator film acquire energy for tunneling through the barrier of the second tunnel insulator film to turn into hot carriers. The hot carriers are injected into the floating gate electrode in an extremely high probability without remaining in the semiconductor region. Thus, data can be readily written.

In this case, the semiconductor memory may further comprise a control gate electrode formed on the channel region through a gate insulator film and a tunnel insulator film formed between the control gate electrode and the floating gate electrode, for writing data by injecting hot carriers from the channel region into the floating gate electrode.

The semiconductor memory according to the aforementioned aspect preferably further comprises a control gate electrode formed on the channel region through a gate insulator film and a tunnel insulator film formed between the control gate electrode and the floating gate electrode, and the thickness of the gate insulator film located under the control gate electrode is preferably smaller than the thickness of the tunnel insulator film located between the control gate electrode and the floating gate electrode. When the thickness of the gate insulator film located under the control gate electrode is thus reduced, the length of the control gate electrode can also be reduced due to the scaling law for transistors. Thus, a small-sized transistor can be formed for providing a semiconductor memory having a high response speed as a result.

The thickness of the gate insulator film located under the control gate electrode is reduced for the following reason: In the semiconductor memory according to the aforementioned aspect, the first source/drain region employed for controlling the potential of the floating gate electrode is brought into a diode structure, so that a negative voltage can be applied to the first source/drain region having a diode structure. Thus, voltages employed for erasing can be sorted into positive and negative levels, whereby the voltage between the control gate electrode and the substrate can be reduced. Therefore, the thickness of the gate insulator film located under the control gate electrode can be reduced. In this case, the thickness of the gate insulator film located under the control gate electrode is preferably not more than half the thickness of the tunnel insulator film located between the control gate electrode and the floating gate electrode.

A semiconductor device according to another aspect of the present invention comprises a first source/drain region and a second source/drain region formed on a first layer consisting of a first conductivity type semiconductor to hold a channel region therebetween and a gate electrode formed on the channel region. Either the first source/drain region or the second source/drain region has a diode structure.

In the semiconductor device according to this aspect, a large amount of current flows from the first source/drain region having a diode structure to a substrate when a channel of a transistor is turned on due to the aforementioned structure. Thus, a large amount of current can be fed also in a transistor having a large gate length and a readily reduced source-to-drain current. Further, a large amount of current can be fed from the first source/drain region to the substrate by simply feeding a current for maintaining the potential of an impurity region forming a lower part of the diode structure at a level substantially identical to the potential of the second source/drain region as the source-to-drain current.

In the semiconductor device according to the aforementioned aspect, the first or second source/drain region having a diode structure preferably includes a second conductivity type first impurity region formed on the first layer consisting of the first conductivity type semiconductor and a first conductivity type second impurity region formed inside the first impurity region, and the first impurity region is preferably formed on the overall region between the first layer and the second impurity region. In this case, the first impurity region can be readily formed through a general ion implantation process, with no burden in process. Thus, the diode structure can be readily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
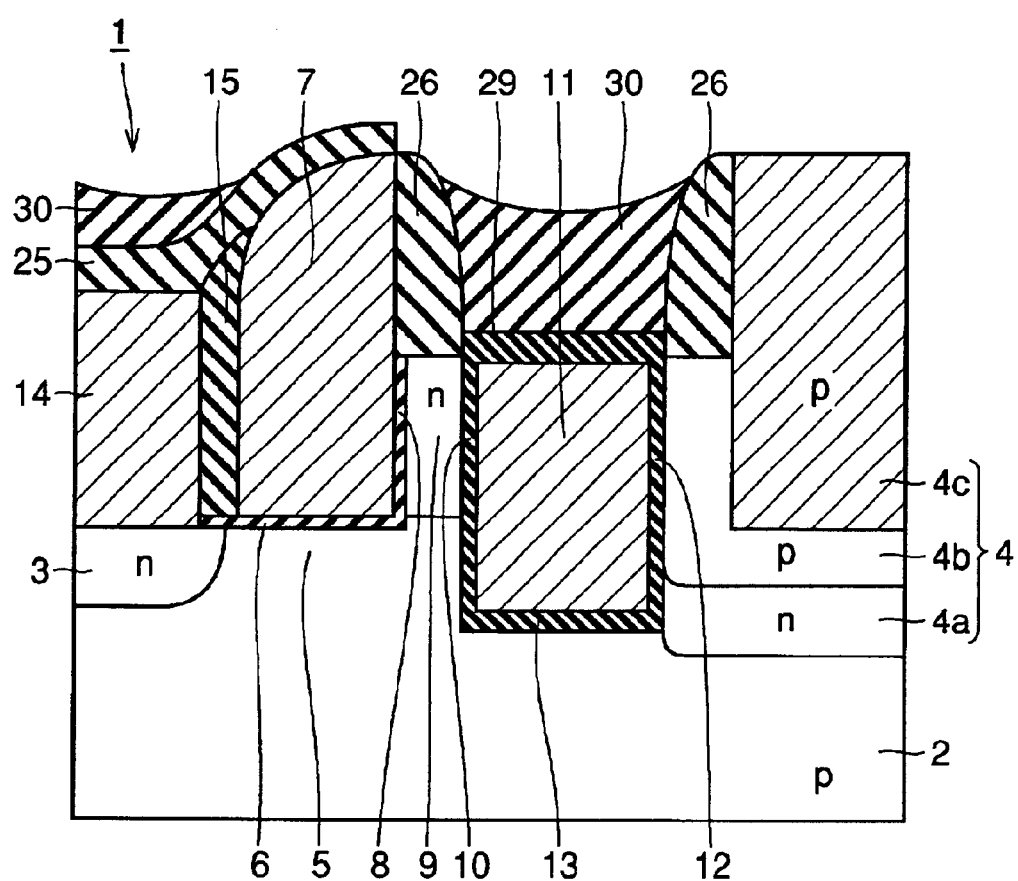
FIG. 1 is a partially fragmented sectional view of a memory cell according to a first embodiment of the present invention.

The structure of a memory cell 1 according to a first embodiment of the present invention is now described with reference to FIG. 1.

In the memory cell 1 according to the first embodiment, an n-type source region 3 and a drain region 4 are formed on the surface of a p-type single-crystalline silicon substrate 2 at a prescribed space. A first gate insulator film 6 of a silicon oxide film, a control gate electrode 7 of a doped polysilicon film, a first tunnel insulator film 8 of a silicon oxide film, an n-type impurity region 9, a second tunnel insulator film 10 of a silicon oxide film, a floating gate electrode 11 of a doped polysilicon film and a third insulator film 12 of a silicon oxide film are formed in this order on a channel region 5 located between the source region 3 and the drain region 4 on the surface of the substrate 2. The floating gate electrode 11 and the channel region 5 are isolated from each other by the second tunnel insulator film 10 and a second gate insulator film 13 of a silicon oxide film.

The floating gate electrode 11 is embedded in a trench formed in the p-type single-crystalline silicon substrate 2, and formed on a side wall of the drain region 4 through the third insulator film 12.

A source electrode 14 of a doped polysilicon film is connected to the source region 3. The source electrode 14 and the control gate electrode 7 are isolated from each other by a fourth insulator film 15 of a silicon oxide film. A thermal oxide film 25 is formed on the source electrode 14 and the control gate electrode 7. Another thermal oxide film 29 is formed on the floating gate electrode 11.

According to the first embodiment, the drain region 4 is formed in a diode structure. In other words, this drain region 4 is formed by an n-type drain region 4a, a p-type drain region 4b and a drain region 4c of a p-type polysilicon film. The n-type drain region 4a is formed on the overall region between the p-type single-crystalline silicon substrate 2 and the p-type drain region 4b. The drain region 4c of a p-type polysilicon film is formed to be embedded in the p-type drain region 4b. The n-type drain region 4a and the p-type drain region 4b are capacitively coupled with the floating gate electrode 11 through the third insulator film 12.

Side wall spacers 26 of silicon nitride films are formed on the side walls of the control gate electrode 7 and the drain region 4c of a p-type polysilicon film. A silicon nitride film 30 is formed on the thermal oxide films 25 and 29.

The thicknesses of the aforementioned members are set as follows:

Thickness of the first gate insulator film 6: 3 to 4 nm

Thickness of the first tunnel insulator film 8: 3 to 4 nm

Thickness of the second tunnel insulator film 10: 8 to 10 nm

Thickness of the third insulator film 12: 8 to 10 nm

Thickness of the second insulator film 13: 8 to 10 nm

Thickness of the fourth insulator film 15: 30 to 40 nm

Width of the n-type impurity region 9 (distance between the first tunnel insulator film 8 and the second tunnel insulator film 10): 20 to 40 nm (the width of the n-type impurity region 9 is most preferably 20 to 30 nm, so that electrons having energy of 3 to 5 eV employed for writing reach the floating gate electrode 11 by at least several %)

The area of the third insulator film 12 located between the drain region 4 and the floating gate electrode 11 is larger than that of the second tunnel insulator film 10 located between the n-type impurity region 9 and the floating gate electrode 11. In the memory cell 1 according to this embodiment, therefore, electrostatic capacitance between the drain region 4 and the floating gate electrode 11 is larger than that between the n-type impurity region 9 and the floating gate electrode 11. Thus, the coupling ratio between the drain region 4 and the floating gate electrode 11 is larger than that between the n-type impurity region 9 and the floating gate electrode 11. Consequently, the potential of the drain region 4 is readily transmitted to the floating gate electrode 11.

Figure 2:
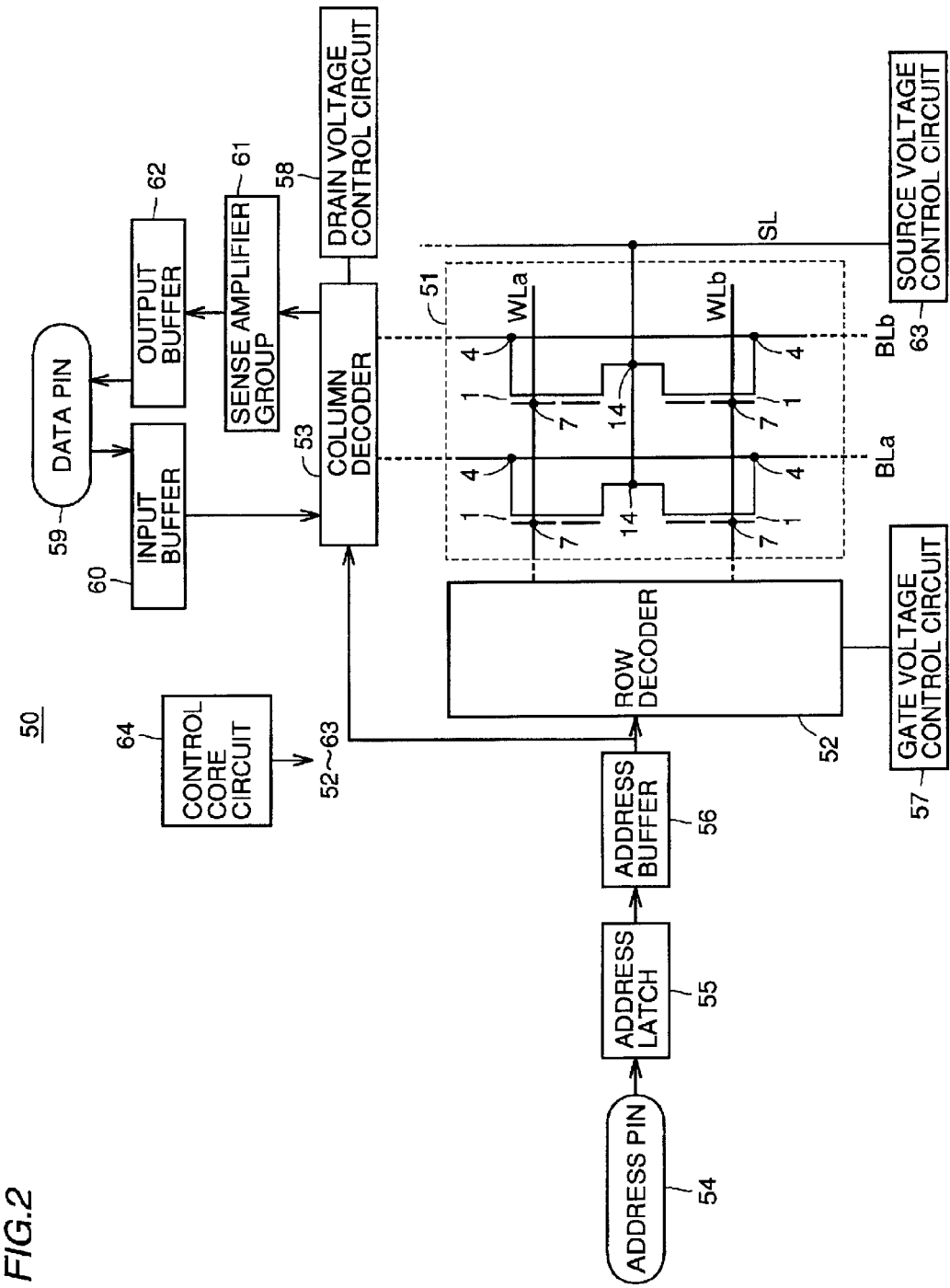
FIG. 2 is a block circuit diagram of a semiconductor memory according to the first embodiment of the present invention.

FIG. 2 shows the overall structure of a nonvolatile semiconductor memory 50 employing the memory cell 1.

As shown in FIG. 2, a memory cell array 51 is formed by arranging a plurality of memory cells 1 in the form of a matrix (FIG. 2 shows only four memory cells 1, for simplifying the illustration).

In the memory cells 1 arranged along the row direction, the control gate electrodes 7 are connected to common word lines $WL_1$ to $WL_n$.

In the memory cells 1 arranged along the column direction, the drain regions 4 are connected to common bit lines $BL_1$ to $BL_n$, and the source electrodes 14 are connected to a common source line SL.

The word lines $WL_1$ to $WL_n$ are connected to a row decoder 52, and the bit lines $BL_1$ to $BL_n$ are connected to a column decoder 53.

Externally specified row and column addresses are input in an address pin 54. The row and column addresses are transferred from the address pin 54 to an address latch 55. In the addresses latched by the address latch 55, the row address is transferred to the row decoder 52 through an address buffer 56, and the column address is transferred to the column decoder 53 through the address buffer 56.

The row decoder 52 selects a word line corresponding to the row address latched by the address latch 55 from the word lines $WL_1$ to $WL_n$, and controls the potentials of the word lines $WL_1$ to $WL_n$ in response to each operation mode described later on the basis of a signal received from a gate voltage control circuit 57.

The column decoder 53 selects a bit line corresponding to the column address latched by the address latch 55 from the bit lines $BL_1$ to $BL_n$, and controls the potentials of the bit lines $BL_1$ to $BL_n$ in response to each operation mode described later on the basis of a signal received from a drain voltage control circuit 58.

Externally specified data is input in a data pin 59. This data is transferred from the data pin 59 to the column decoder 53 through an input buffer 60. The column decoder 53 controls the potentials of the bit lines $BL_1$ to $BL_n$ in correspondence to the data as described later.

Data read from an arbitrary memory cell 1 is transferred from the bit lines $BL_1$ to $BL_n$ to a sense amplifier group 61 through the column decoder 53. The sense amplifier group 61 is formed by current sense amplifiers. The data determined by the sense amplifier group 61 is output from an output buffer 62 through the data pin 59.

A source voltage control circuit 63 controls the potential of the source line SL in correspondence to each operation mode described later.

A control core circuit 64 controls the operations of the aforementioned circuits 52 to 63.

The operations (writing, erasing and reading) of the memory cell 1 having the aforementioned structure are now described. A source voltage Vs is applied to the source region 3 (source electrode 14) through the source line SL. A drain voltage Vd is applied to the drain region 4 through the bit lines $BL_1$ to $BL_n$. A control gate voltage Vcg is applied to the control electrode 7 through the word lines $WL_1$ to $WL_n$. A substrate voltage Vsub is applied to the substrate 2.

Writing

Before writing, the floating gate electrode 11, which is in an erased state (where electrons are extracted), keeps a potential of about 2 V in the first embodiment. According to the first embodiment, threshold voltages Vt of transistors having the floating gate electrode 11 and the control gate electrode 7 as the gates respectively are set to 0.5 V.

In writing, operating voltages of the memory cell 1, i.e., the source voltage Vs, the drain voltage Vd, the control gate voltage Vcg and the substrate voltage (hereinafter referred to as a well voltage when the memory cell 1 is formed on a p-type well formed in the silicon substrate 2) Vsub are set to 0 V, 3 V, −3 V and 0 V respectively.

The drain region 4 and the floating gate electrode 11 are strongly capacitively coupled with each other as described above, and hence about ⅔ of the drain voltage Vd (3 V) is added to the potential (about 2 V) of the floating gate electrode 11 in the erased state, thereby increasing the potential of the floating gate electrode 11 to about 4 V. Thus, the transistor having the floating gate electrode 11 as the gate is turned on and the potential of the n-type impurity region 9 reaches a level substantially identical to the potential of the drain region 4.

In other words, the potential of the n-type impurity region 9 reaches 3 V (level-shifted from the potential of the floating gate electrode 11 by the aforementioned threshold voltage Vt with the upper limit of the drain voltage Vd), and a high electric field is generated between the n-type impurity region 9 and the control gate electrode 7. Consequently, an F-N tunnel current flows and electrons move from the control gate electrode 7 to the n-type impurity region 9. Electrons transmitted through (tunneling through) the barrier of the first tunnel insulator film 8 between the control gate electrode 7 and the n-type impurity region 9 are accelerated by the high electric field generated between the n-type impurity region 9 and the control gate electrode 7, and injected into the floating gate electrode 11 through the second tunnel insulator film 10. Consequently, the floating gate electrode 11 stores the electrons for writing data.

The energy necessary for the electrons for tunneling through the barrier of the second tunnel insulator film 10 of a silicon oxide film is 3.2 eV, and potential difference necessary for acquiring this energy is 3.2 V. Therefore, the aforementioned operating voltages in writing are so set that potential difference of at least 3.2 V is caused between the control gate electrode 7 and the n-type impurity region 9 and between the control gate electrode 7 and the floating gate electrode 11.

When the drain voltage Vd and the control gate voltage Vcg are set to 3 V and −3 V respectively, the voltage of the floating gate electrode 11 reaches about 4 V due to electrostatic coupling between the drain region 4 and the floating gate electrode 11 as described above, and the potential of the n-type impurity region 9 reaches about 3 V. Therefore, potential difference of 6 V is initially developed between the control gate electrode 7 and the n-type impurity region 9, and potential difference of about 7 V is initially developed between the control gate electrode 7 and the floating gate electrode 11.

When the energy of the electrons is 3.2 eV, the mean free path (the mean value of the distances of movement of the electrons) is about 30 to 40 nm. The width of the n-type impurity region 9 is set to 30 nm, which is smaller than the mean free path. Thus, the electrons transmitted through the barrier of the first tunnel insulator film 8 between the control gate electrode 7 and the n-type impurity region 9 are accelerated to at least 3.2 eV at a short distance smaller than the mean free path (about 30 to 40 nm).

Therefore, almost all electrons transmitted through the barrier of the first tunnel insulator film 8 acquire the energy for tunneling through the barrier (3.2 eV) of the second tunnel insulator film 10 and turn into hot electrons, which in turn are injected into the floating gate electrode 11 in an extremely high probability without remaining in the n-type impurity region 9.

The energy of the electrons and the probability of tunneling through the barrier of the first tunnel insulator film 8 can be adjusted by the source voltage Vs, the drain voltage Vd and the control gate voltage Vcg. Therefore, the hot electrons can be injected into the floating gate electrode 11 when acquiring energy slightly exceeding the barrier of the second tunnel insulator film 10.

As hereinabove described, the potential difference of at least 3.2 V is developed between the control gate electrode 7 and the n-type impurity region 9 and between the control gate electrode 7 and the floating gate electrode 11 in the initial stage of writing according to the first embodiment, and hence writing is continuously performed (electrons are injected into the floating gate electrode 11). Following progress of writing, the electrons are continuously injected into the floating gate electrode 11 and hence the potential of the floating gate electrode 11 is gradually reduced from 4 V. As hereinabove described, the potential of the n-type impurity region 9 reaches a value level-shifted from the potential of the floating gate electrode 11 by the aforementioned threshold voltage Vt with the upper limit of the drain voltage Vd. Therefore, the potential of the n-type impurity region 9 is also gradually reduced following this reduction of the potential of the floating gate electrode 11, and the potential difference between the control gate electrode 7 and the n-type impurity region 9 finally reaches a level less than 3.2 V. Thus, the electrons in the control gate electrode 7 cannot be transmitted through the barrier of the first tunnel insulator film 8, and no more writing is performed.

According to this embodiment, writing is automatically ended due to potential change of the floating gate electrode 11, and hence no circuit is required for separately detecting termination of writing. Thus, a simple structure of a peripheral circuit, a small area and low power consumption can be implemented. According to this embodiment, further, writing is not ended with a constant write voltage but automatically ended due to potential change of the floating gate electrode 11, whereby the memory cells 1 can be effectively prevented from dispersion in writing level. Consequently, the writing levels of the memory cells 1 can be substantially homogenized.

Erasing

As to operating voltages in erasing according to the first embodiment, a negative voltage is applied to the drain region 4 having a diode structure. More specifically, the operating voltages of the memory cell 1, i.e., the source voltage Vs, the drain voltage Vd, the control gate voltage Vcg and the substrate voltage (well voltage) Vsub are set to 5.5 V, −4 V, 5.5 V and 0 V respectively in erasing. In this case, the drain region 4 and the floating gate electrode 11 are strongly capacitively coupled with each other and hence the potential of the floating gate electrode 11 substantially reaches −3 V.

The potential of the control gate electrode 7 is 5.5 V, and hence the transistor having the control gate electrode 7 as the gate is turned on. Thus, the potential of the n-type impurity region 9 reaches a level substantially identical to the potential of the source region 3. In other words, the potential of the n-type impurity region 9 reaches 5 V (voltage level-shifted from the potential of the control gate voltage 7 by the aforementioned threshold voltage Vt with the upper limit of the source voltage Vs). Thus, a high electric field of about 10 MV is generated in the second tunnel insulator film 10 located between the n-type impurity region 9 and the floating gate electrode 11. Consequently, an F-N tunnel current flows and electrons are extracted from the floating gate electrode 11 to the n-type impurity region 9, for erasing data.

According to the first embodiment, the following functions/effects can be attained:

(1) The n-type drain region 4a and the p-type drain regions 4b and 4c form a diode, so that a negative voltage can be readily applied to the drain regions 4b and 4c without employing a complicated structure such as the conventional triple well structure. Thus, voltages employed for erasing can be sorted into positive and negative levels, whereby the maximum voltage generated through a step-up circuit can be substantially halved. More specifically, the operating voltages of the memory cell 1 can be set within the range of +6 V in erasing. Thus, the operating voltages and power consumption in erasing can be reduced as compared with the conventional stacked gate or split gate memory cell. The scale of the step-up circuit is reduced, and hence the degree of integration can be improved.

Further, a negative voltage can be employed for a cell region without introducing the same into the substrate 2, to require no process such as high-energy ion implantation for forming a triple well structure necessary for introducing the negative voltage into the substrate 2. According to the first embodiment, the p-type drain region 4b can be readily formed through a general impurity ion implantation process, with no burden in process.

When a negative voltage is applied to the drain region 4 without employing the diode structure according to the first embodiment, an excessive current may flow between the drain region 4a and the p-type silicon substrate 2, while an excessive current may flow also between the source region 3 and the drain region 4 after erasing if either the source region 3 or the drain region 4 is brought into a floating state in erasing. In this case, the excessive current may disadvantageously exceed the amount of allowable current of the step-up circuit. According to the first embodiment, such an excessive current can be effectively prevented due to the diode structure.

(2) The n-type drain region 4a and the p-type drain region 4b are capacitively coupled with the floating gate electrode 11 through the third insulator film 12, whereby the voltage of the p-type drain region 4b directly applied from a power source through a wire can be efficiently transmitted to the floating gate electrode 11 due to the capacitive coupling.

(3) In erasing, the potential of the n-type impurity region 9 can be controlled regardless of the potential of the floating gate electrode 11 by controlling the source voltage Vs and the control gate voltage Vcg. Therefore, no circuit is required for controlling the potential of the n-type impurity region 9, and reduction of the layout area and low power consumption can be implemented.

Third Embodiment

Figure 3:
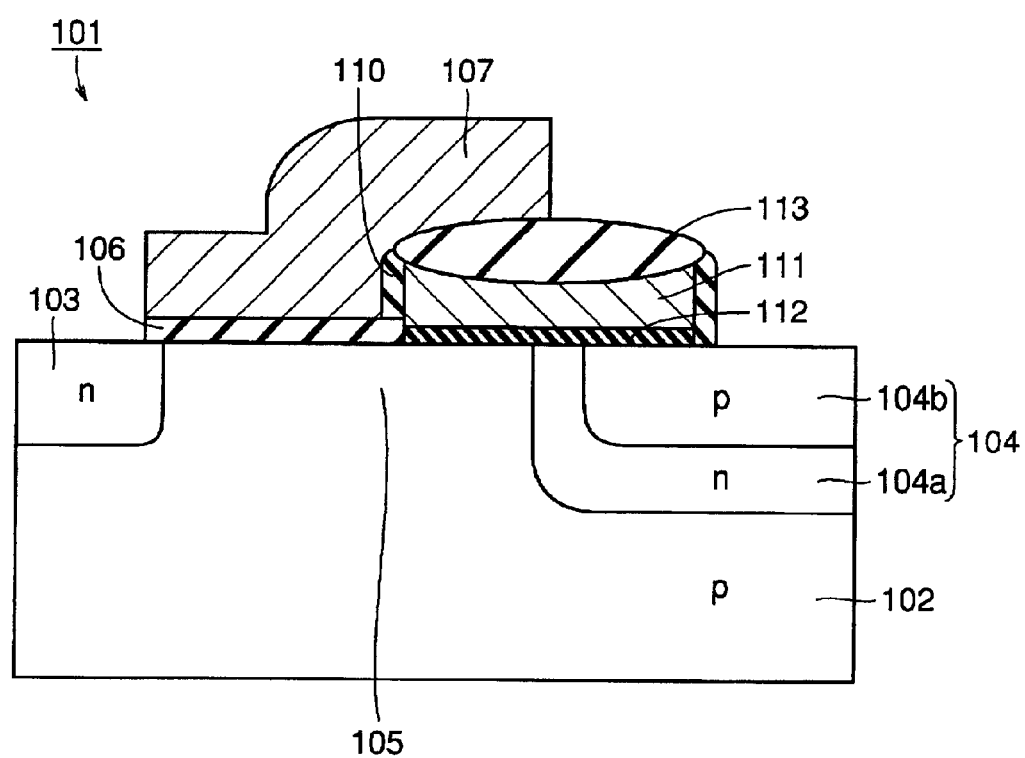
FIG. 3 is a partially fragmented sectional view of a memory cell according to a second embodiment of the present invention.
Figure 4:
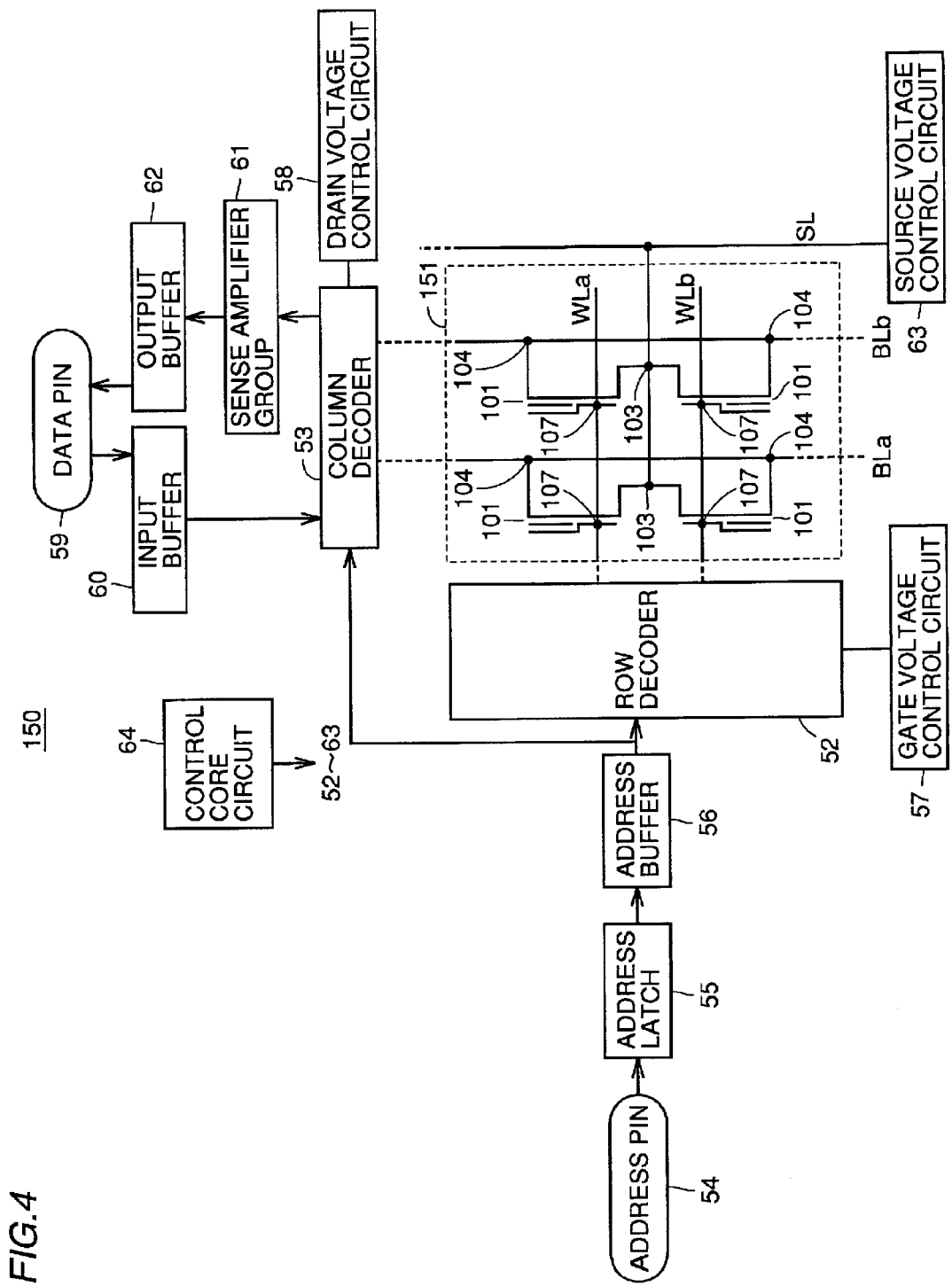
FIG. 4 is a block circuit diagram of a semiconductor memory according to the second embodiment of the present invention.

FIG. 3 is a partially fragmented sectional view of a memory cell 101 according to a second embodiment of the present invention, and FIG. 4 is a block diagram showing the overall structure of a nonvolatile semiconductor memory 150 employing the memory cell 101 according to the second embodiment shown in FIG. 3.

Referring to FIG. 3, the memory cell 101 according to the second embodiment has the structure of the conventional split gate memory cell, with a drain region having a diode structure employed for controlling the potential of a floating gate electrode.

More specifically, an n-type source region 103 and a drain region 104 are formed on the surface of a p-type single-crystalline silicon substrate 102 through a channel region 105 in the memory cell 101 according to the second embodiment, as shown in FIG. 3. The drain region 104 is formed by an n-type drain region 104a formed on the surface of the p-type single-crystalline silicon substrate 102 and a p-type drain region 104b formed inside the n-type drain region 104a. In this case, the n-type drain region 104a is formed on the overall region between the p-type drain region 104b and the p-type single-crystalline silicon substrate 102.

A floating gate electrode 111 is formed on the channel region 105 and the drain region 104 through a second gate insulator film 112. An upper insulator film 113 is formed on the floating gate electrode 111. A tunnel insulator film 110 is formed on the side surface of the floating gate electrode 111. A control gate electrode 107 is formed on the channel region 105 through a first gate insulator film 106. The control gate electrode 107 is formed to be located on the floating gate electrode 111 through the tunnel insulator film 110 and the upper insulator film 113.

The second gate insulator film 112 has a thickness of about 8 nm. The tunnel insulator film 110 has a thickness of about 10 nm to 30 nm. The first gate insulator film 106 has a thickness of about 10 nm to 30 nm. The control gate electrode 107 has a thickness of about 30 nm to 200 nm, and the floating gate electrode 111 has a thickness of about 30 nm to 200 nm.

The overall structure of the nonvolatile semiconductor memory 150 employing the memory cell 101 according to the second embodiment shown in FIG. 3 is now described with reference to FIG. 4. The overall structure of the nonvolatile semiconductor memory 150 is substantially similar to the structure of the nonvolatile semiconductor memory 50 according to the first embodiment shown in FIG. 2, except the memory cells 101 in a memory cell array 151. The memory cell array 151 according to the second embodiment is formed by arranging a plurality of memory cells 101 in the form of a matrix (FIG. 4 shows only four memory cells 101 for simplifying the illustration).

In the memory cells 101 arranged along the row direction, the control gate electrodes 107 are connected to common word lines $WL_1$ to $WL_n$.

In the memory cells 101 arranged along the column direction, the drain regions 104 having a diode structure are connected to common bit lines $BL_1$ to $BL_n$, and the source regions 103 are connected to a common source line SL. The word lines $WL_1$ to $WL_n$ are connected to a row decoder 52, and the bit lines $BL_1$ to $BL_n$ are connected to a column decoder 53.

The functions of circuits 52 to 64 shown in FIG. 4 are similar to those of the circuits 52 to 64 according to the first embodiment shown in FIG. 2.

Operations (writing, erasing and reading) of the memory cell 101 having the aforementioned structure are now described. A source voltage Vs is applied to the source region 103 through the source line SL. A drain voltage Vd is applied to the drain region 104 through the bit lines $BL_1$ to $BL_n$. A control gate voltage Vcg is applied to the control electrode 107 through the word lines $WL_1$ to $WL_n$. A substrate voltage Vsub is applied to the substrate 102. In a split gate flash memory according to the second embodiment, threshold voltages Vt of transistors having the floating gate electrode 111 and the control gate electrode 107 as the gates respectively are 0.5 V.

In writing, operating voltages of the memory cell 101, i.e., the source voltage Vs, the drain voltage Vd, the control gate voltage Vcg and the substrate voltage Vsub are set to 0 V, 12 V, 2 V and 0 V respectively. As hereinabove described, the threshold voltage Vt of the transistor formed by the control gate electrode 107 and the source and drain regions 103 and 104 is 0.5 V in the memory cell 101. Therefore, electrons in the source region 103 move to the channel region in an inverted state. Thus, a current (cell current) Id flows from the drain region 104 to the source region 103.

The drain voltage Vd of 12 V is applied to the drain region 104, and hence the potential of the floating gate electrode 111 is pulled up by capacitive coupling between the drain region 104 and the floating gate electrode 111. Therefore, the source voltage Vs is transmitted to a channel located under the control gate electrode 107, and a voltage close to the drain voltage Vd is transmitted to a channel located under the floating gate electrode 111. Thus, a high electric field is generated in a channel located immediately under the oxide film 110 held between the control gate electrode 107 and the floating gate electrode 111. Therefore, electrons in the channel region are accelerated to turn into hot electrons, which in turn are injected into the floating gate electrode 111.

In other words, electrons flow from the source region 103 to the drain region 104, to be partially (about 1/1000) injected into the floating gate electrode 111. Consequently, the floating gate electrode 111 of a selected memory cell 101 stores charges for writing and storing 1-bit data.

Erasing

In erasing according to the second embodiment, the drain region 104 is provided in a diode structure so that a negative voltage can be applied to the drain region 104. Thus, voltages can be sorted into positive and negative levels, and the maximum voltage generated through a step-up circuit can be substantially halved.

More specifically, the operating voltages of the memory cell 101, i.e., the source voltage Vs, the drain voltage Vd, the control gate voltage Vcg and the substrate voltage (well voltage) Vsub are set to 0 V, −4 V, 5.5 V and 0 V respectively.

Comparing the electrostatic capacitance between the drain region 104 and the substrate 102 and the floating gate electrode 111 with that between the control gate electrode 107 and the floating gate electrode 111, the former is overwhelmingly larger than the latter. When the voltages of the control gate electrode 107 and the drain region 104 are 5.5 V and −4 V respectively, therefore, a high electric field is generated between the control gate electrode 107 and the floating gate electrode 111. Consequently, an F-N tunnel current flows and electrons in the floating gate electrode 111 are extracted toward the control gate electrode 107, for erasing data stored in the memory cell 101.

Reading

In reading, a voltage of 4 V is supplied to the word line $WL_m$ connected to the control gate electrode 107 of the selected memory cell 101, while the potentials of the remaining word lines (non-selected word lines) are set to the ground level. A voltage of 2 V is supplied to the bit line $BL_m$ connected to the drain region 104 of the selected memory cell 101, while the potentials of the remaining bit lines are set to the ground level.

Electrons are extracted from the floating gate electrode 111 of the memory cell 101 in an erased state, and hence the floating gate electrode 111 is charged plus. Electrons are injected into the floating gate electrode 111 of the memory cell 101 in a written state, and hence the floating gate electrode 111 is charged minus. Therefore, the channel region 105 located immediately under the floating gate electrode 111 of the memory cell 101 in an erased state is in on, while the channel region 105 located immediately under the floating gate electrode 111 of the memory cell 101 in a written state is off. When a voltage of 4 V is applied to the control gate electrode 107, therefore, the cell current Id flowing from the drain region 104 toward the source region 103 is larger in the memory cell 101 of an erased state than in the memory cell 101 of a written state.

When the magnitudes of the cell currents Id of the respective memory cells 101 are determined by sense amplifiers forming a sense amplifier group 61, the values of data stored in the memory cells 101 can be read.

According to the second embodiment, the following function/effect can be attained in addition to those of the first embodiment:

(4) Also in a transistor of the split gate flash memory or the like according to the second embodiment having a large channel length, a large amount of current can be supplied in reading. When the channel of the transistor is turned on in reading, a large amount of current flows from the drain region 104 having a diode structure to the substrate 102. Thus, a large amount of current can be supplied in reading, and high-speed reading can be implemented also in a split gate flash memory having a large channel length as a result.

Third Embodiment

Figure 5:
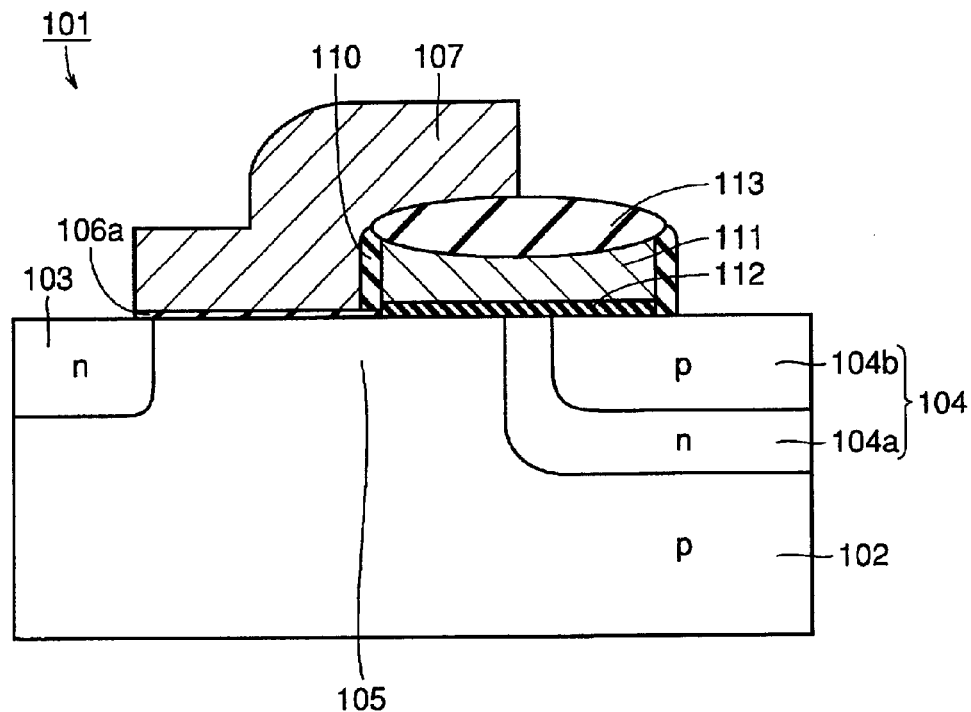
FIG. 5 is a partially fragmented sectional view of a memory cell according to a third embodiment of the present invention.

Referring to FIG. 5, a memory cell 101 according to a third embodiment of the present invention is a split gate memory cell, similarly to the memory cell 101 according to the second embodiment. While the memory cell 101 according to the third embodiment is substantially similar in structure to the memory cell 101 according to the second embodiment shown in FIG. 3, the thickness of a first gate insulator film 106a located under a control gate electrode 107 is reduced in the memory cell 101 according to the third embodiment. In the third embodiment shown in FIG. 5, the thickness of the first gate insulator film 106a located under the control gate electrode 107 is set to not more than 8 nm, i.e., not more than half the thickness (10 nm to 30 nm) of a tunnel insulator film 110 located between the control gate electrode 107 and a floating gate electrode 111.

In the third embodiment, the thickness of the first gate insulator film 106a located under the control gate electrode 107 is reduced for the following reason: According to the third embodiment, a drain region 104 is brought into a diode structure similarly to the aforementioned first and second embodiments, so that a negative voltage can be applied to the drain region 104 in erasing. Thus, voltages employed for erasing can be sorted into positive and negative levels, whereby the voltage between the control gate electrode 107 and a substrate can be reduced. Therefore, the thickness of the first gate insulator film 106a located under the control gate electrode 107 can be reduced as compared with the prior art.

According to the third embodiment having the aforementioned structure, the following function/effect can be attained in addition to those of the first and second embodiments:

(5) In the third embodiment, the thickness of the first gate insulator film 106a located under the control gate electrode 107 is reduced to not more than half the thickness of the insulator film 110 located between the control gate electrode 107 and the floating gate electrode 111 so that the length of the control gate electrode 107 can also be reduced due to the scaling law for transistors. Thus, a small-sized transistor can be formed for providing a flash memory having a high response speed as a result.

Fourth Embodiment

Figure 6:
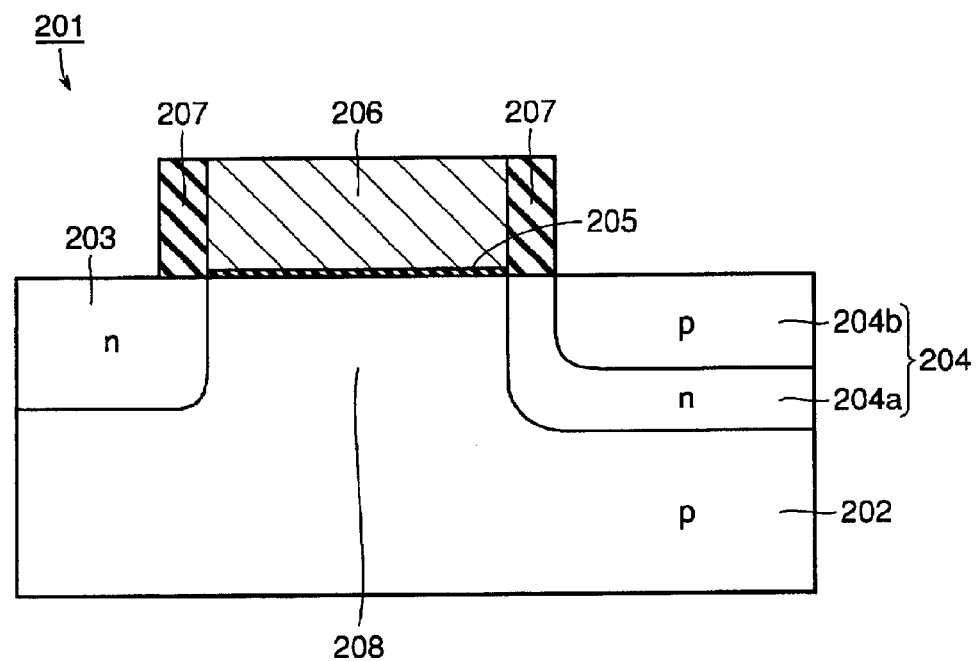
FIG. 6 is a partially fragmented sectional view showing a field-effect transistor according to a fourth embodiment of the present invention.

FIG. 6 is a sectional view showing a field-effect transistor according to a fourth embodiment of the present invention. Referring to FIG. 6, either a source region or a drain region is formed in a diode structure in the field-effect transistor according to the fourth embodiment.

More specifically, an n-type source region 203 and a drain region 204 having a diode structure are formed on the surface of a p-type single-crystalline silicon substrate 202 at a prescribed space to hold a channel region 208 therebetween in the field-effect transistor according to the fourth embodiment. The drain region 204 having a diode structure is formed by an n-type drain region 204a formed on the surface of the p-type single-crystalline semiconductor substrate 202 and a p-type drain region 204b formed inside the n-type drain region 204a. The n-type drain region 204a is formed on the overall region between the p-type drain region 204b and the p-type single-crystalline semiconductor substrate 202. A gate electrode 206 is formed on the channel region 208 through a gate insulator film 205. Side wall insulator films 207 are formed on both side surfaces of the gate electrode 206.

According to the fourth embodiment, the following function/effect can be attained in addition to those of the first to third embodiments:

(6) According to the fourth embodiment, a large amount of current flows from the drain region 204 having a diode structure to the substrate 202 when the channel of the transistor is turned on. Thus, a large amount of current can be fed also in a transistor having a large gate length and a readily reduced source-to-drain current. Further, a large amount of current can be fed from the drain region 204 having a diode structure to the substrate 202 by simply feeding a current for maintaining the potential of the n-type drain region 204a forming a lower part of the diode structure at a level substantially identical to the potential of the source region 203 as a source-to-drain current.

Although the present invention has been described and illustrated in detail, it is clearly understood that the same is by way of illustration and example only and is not to be taken by way of limitation, the spirit and scope of the present invention being limited only by the terms of the appended claims.

While the substrate is of a p type, the source region is of an n type and the drain region is formed by the outer n-type drain region and the inner p-type drain region in each of the aforementioned embodiments, the present invention is not restricted to these but the substrate may be of an n type, the source region may be of a p type and the drain region may be formed by an outer p-type drain region and an inner n-type drain region, for example.

What is claimed is:

1. A semiconductor memory comprising:
   a floating gate electrode;
   a first source/drain region having a diode structure employed for controlling the potential of said floating gate electrode; and
   a second source/drain region formed to hold a channel region between said first source/drain region and said second source/drain region,
   wherein said first source/drain region includes:
   a second conductivity type first impurity region formed on a first layer consisting of a first conductivity type semiconductor; and
   a first conductivity type second impurity region formed inside said first impurity region.

2. The semiconductor memory according to claim 1, wherein
   a negative voltage is applied to said first source/drain region for erasing.

3. The semiconductor memory according to claim 1, wherein
   said first impurity region is formed on the overall region between said first layer and said second impurity region.

4. The semiconductor memory according to claim 3, wherein
   said second impurity region includes:
   a first conductivity type third impurity region formed on said first layer to be in contact with said first impurity region, and
   a fourth impurity region formed by a first conductivity type semiconductor film embedded in said third impurity region.

5. The semiconductor memory according to claim 3, wherein
   said second impurity region is capacitively coupled with said floating gate electrode through a first insulator film.

6. The semiconductor memory according to claim 5, further comprising:
   a control gate electrode formed on said channel region through a gate insulator film,
   a semiconductor region formed between said control gate electrode and said floating gate electrode,
   a first tunnel insulator film formed between said semiconductor region and said control gate electrode, and
   a second tunnel insulator film formed between said semiconductor region and said floating gate electrode,
   for writing data by injecting hot carriers into said floating gate electrode from said control gate electrode through said first tunnel insulator film, said semiconductor region and said second tunnel insulator film.

7. The semiconductor memory according to claim 6, wherein
   the area of said first insulator film located between said second impurity region and said floating gate electrode is larger than the area of said second tunnel insulator film located between said semiconductor region and said floating gate electrode.

8. The semiconductor memory according to claim 7, wherein
   a voltage applied to said second impurity region is transmitted to said floating gate electrode through electrostatic coupling between said second impurity region and said floating gate electrode so that a transistor having said floating gate electrode as the gate enters an ON state and the potential of said semiconductor region reaches a level substantially identical to the potential of said second impurity region.

9. The semiconductor memory according to claim 6, wherein
   said semiconductor region has a second conductivity type.

10. The semiconductor memory according to claim 6, wherein
    the width of maid semiconductor region is set substantially not more than the mean free path of carriers, transmitted through the barrier of said first tunnel insulator film between said control gate electrode and said semiconductor region, having energy necessary far tunneling through the barrier of said second tunnel insulator film.

11. The semiconductor memory according to claim 5, further comprising:
    a control gate electrode formed on said channel region through a gate insulator film, and
    a tunnel insulator film formed between said control gate electrode and said flouting gate electrode,
    for writing data by injecting hot carriers from said channel region into said floating gate electrode.

12. The semiconductor memory according to claim 1, further comprising:
    a control gale electrode formed on said channel region through a gate insulator film, and
    a tunnel insulator film formed between said control gate electrode and said floating gate electrode, wherein
    the thickness of said gate insulator film located under said control gate electrode is smaller than the thickness of said tunnel insulator film located between said control gate electrode and said floating gate electrode.

13. The semiconductor memory according to claim 12, wherein the thickness of said gate insulator film located under said control gate electrode is not more than half the thickness of said tunnel insulator film located between said control gate electrode and said floating gate electrode.

14. A semiconductor device comprising:

a first source/drain region and a second source/drain region formed on a first layer consisting of a first conductivity type semiconductor to hold a channel region therebetween; and a gate electrode formed on said channel region, wherein either said first source/drain region or said second source/drain region has a diode structure.

wherein said first or second source/drain region having a diode structure includes:

a second conductivity type first impurity region formed on said first layer consisting of said first conductivity type semiconductor, and a first conductivity type second impurity region formed inside said first impurity region, and wherein said first impurity region is formed on the overall region between said first layer and said second impurity region.

* * * * *